March 7, 1933. C. F. JENKINS Re. 18,756
RESISTOR CELL CIRCUIT
Original Filed Oct. 22, 1924
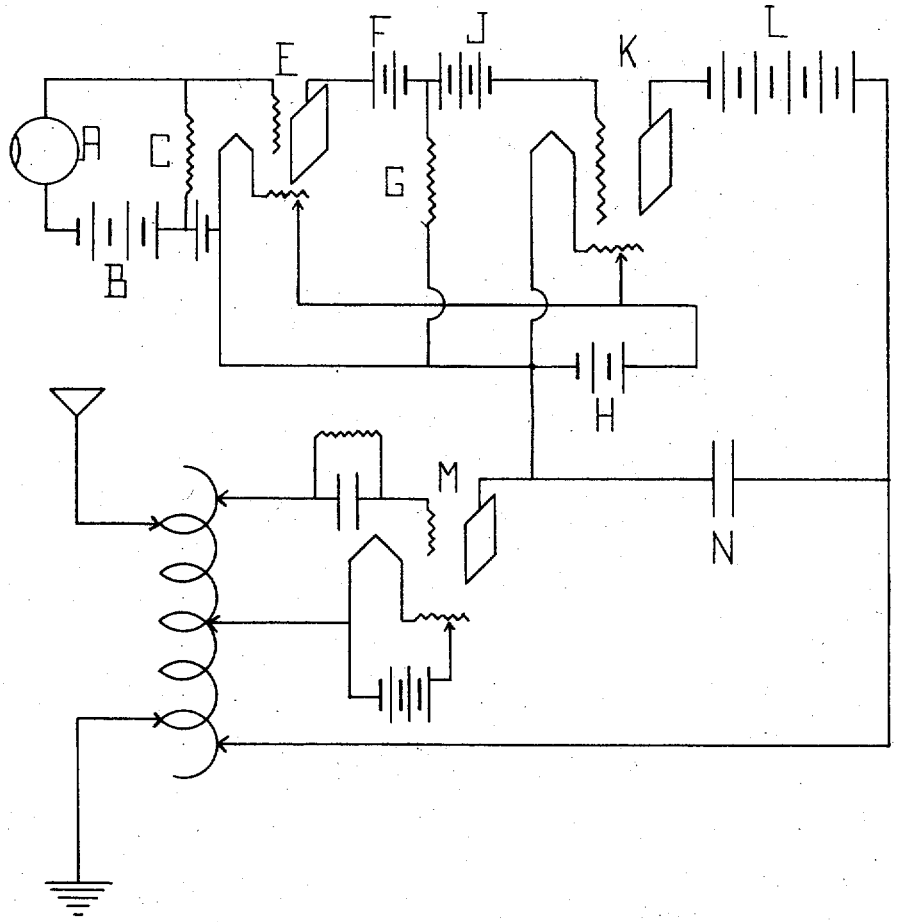
Inventor
C. Francis Jenkins
Witness:
Sylvil F. Armand Reissued Mar. 7, 1933

Re. 18,756

UNITED STATES PATENT OFFICE

CHARLES FRANCIS JENKINS, OF WASHINGTON, DISTRICT OF COLUMBIA, ASSIGNOR TO JENKINS LABORATORIES, OF WASHINGTON, DISTRICT OF COLUMBIA, A CORPORATION OF THE DISTRICT OF COLUMBIA

RESISTOR CELL CIRCUIT

Original No. 1,693,509, dated November 27, 1928, Serial No. 745,215, filed October 22, 1924. Application for reissue filed May 7, 1930. Serial No. 450,530.

This invention relates to radio circuits in which a light-sensitive cell is employed to modulate the circuit, and its principal object is to so control the circuit as to interrupt a continuous wave as though it were "key modulated".

With this and other objects in view, the arrangement of the elements of the circuit is described herein, illustrated in the drawing, and particularly pointed out in the claims.

The whole is a system for controlling an oscillator of radio frequency by the action of light on a photo-electric cell. It employs a resistance-coupled amplifier to amplify the direct current effect of changing light on the cell. The grid batteries are adjusted to give a clean off-and-on of the plate current in the last tube of the amplifier, and this tube acts as a valve or key in the circuit of the oscillator.

In the drawing A is a light-sensitive cell; B a battery and C a resistance, both in circuit with the cell; E a "detector" tube; F a battery and G a resistance, both in the plate circuit of the tube E; H is a filament battery; J a battery in the grid circuit of amplifier tube K. L is a battery in the plate circuit of amplifier tube K. The plates of amplifier tube K and oscillator tube M are in series, the oscillator current being by-passed through condenser N.

In operation, light falling on the cell A varies the electric current in the cell circuit which disturbs the static condition of the grid circuit. This effect is amplified, and interrupts the oscillation of tube M, the oscillation of the tube being resumed as soon as the original condition of the cell A is restored.

If then, typewritten or hand-written letters (black on white paper, for example) were made to cross the light cell, or any other means were employed to cut the light off and on the cell, the intermittent effect of the light on the cell would react to interrupt the oscillation of the transmitter.

As a result of long continued experiments in my laboratory, I have discovered that the use of an audio amplifying method with a flat characteristic, i. e., one affording straight-line amplification, such as resistance-coupled amplification, gives most efficient results because of its smoothness in picture transmitting and receiving systems within at least the short wave and broadcast meter bands, and further that this method of amplification provides in connection with a method of modulation of the character set forth, to wit, plate modulation, a combination of amplifying and modulating methods whereby an effective operating condition is established for a clean, sharp cut-off action, equivalent to that secured by key controlled modulation. By this means, as has been demonstrated both by my laboratory experiments, and by actual picture broadcasting from my station 3XK, the production of strong and sharply defined signals for long distance radio transmission of black and white images is rendered possible to obtain at the receiver pictures which are very clear and distinct and sharply bordered and free from fringe effects due to lag and other defects incidental to slow and irregular cut-off actions.

The term series oscillator-modulator is employed in the following claims to describe the combination of an oscillator and modulator tube of the space discharge type wherein the space currents of both the oscillator and the modulator are connected in series as shown in the drawing.

What is claimed is—

1. In a radio amplifier and modulator, a light sensitive cell, a three-element tube, a resistance coupling between said cell and tube, an amplifier, a resistance coupling between said tube and amplifier, a source of potential in circuit with the cell and grid of the tube, sources of potential located respectively in the plate circuit of the tube and grid circuit of the amplifier on opposite sides of the second-named resistance coupling, an oscillating tube, a conductor connecting the plate of the amplifier in series with the plate of the oscillating tube, a source of potential in said conductor, and a by-pass condenser in said conductor between said source of potential therein and the plate of the oscillating tube.

2. In combination a first electron discharge device, circuits for causing said device normally to generate sustained oscillations, another electron discharge amplifying device, means for applying an operating plate potential to said first electron discharge device through the conducting space between the anode-cathode of said amplifier device, a light sensitive cell controlling said second device, and means for biasing the grid of the second device to provide sharp off and on control of oscillations by said cell.

3. In a system for sharply starting and stopping radio frequency oscillations the combination of an amplifier tube, an oscillator tube, the space current circuits of both said tubes being connected in series, a light sensitive cell controlling the input circuit of said amplifier tube, and means for statically biasing the grid of said amplifier tube to provide sharp starting and stopping of oscillations under control of said cell.

4. In a system for sharply starting and stopping oscillations, the combination of an electron discharge oscillator tube, an amplifier tube having its space current circuit in series with the space current circuit of said oscillator tube, another amplifier tube resistance coupled to the first mentioned amplifier tube, a light sensitive cell controlling said amplifier tubes, and means for statically biasing the grid of the first mentioned one of said amplifier tubes to provide sharp on and off control of the oscillations by said cell.

5. The method of signaling employing a series oscillator-modulator which comprises varying the conductivity of the modulator in accordance with light signals to control the amplitude of the oscillations from the oscillator, and statically biasing the modulator to provide sharp on and off control of the oscillations by the light signals.

6. In a signaling system the combination of a series oscillator-modulator, means for varying the conductivity of the modulator in accordance with light signals to control the amplitude of the oscillations from the oscillator, and means for statically biasing the grid of the modulator to provide sharp on and off control of the oscillations by the light signals.

7. In a signaling system, a series oscillator-modulator, circuit arrangements for causing the oscillator normally to generate sustained oscillations, means for varying the conductivity of the modulator in accordance with light signals, and means for statically biasing the modulator to cause the sharp cessation of oscillations by the light signals.

8. In combination a series oscillator-modulator, means for adjusting the oscillator-modulator normally to generate sustained oscillations, means for adjusting the normal conductivity of said modulator, and means including a source of light signals for varying the conductivity of the modulator to provide sharp on and off control of the oscillations by the light signals.

9. In a system of the character described the combination of a light sensitive cell, a resistance coupled amplifier for amplifying the resistance of said cell to light, a modulator tube, a resistance coupling between said amplifier tube and said modulator tube, an oscillator tube associated with said modulator tube, the anode-cathode circuit of said modulator tube being in series with the anode-cathode circuit of said oscillator tube, and means for statically biasing the grid of said modulator tube so that said oscillator normally generates sustained oscillations, and when light is incident on said cell, the generation of oscillations is sharply interrupted.

In testimony whereof I have hereunto set my hand on this 5th day of May, 1930.

CHARLES FRANCIS JENKINS.